(12) United States Patent
Langari et al.

(10) Patent No.: US 6,586,847 B1
(45) Date of Patent: Jul. 1, 2003

(54) METHOD AND STRUCTURE FOR TEMPERATURE STABILIZATION IN SEMICONDUCTOR DEVICES

(75) Inventors: Abdolreza Langari, Newport Beach, CA (US); Surasit Chungpaiboonpatana, Irvine, CA (US); Seyed H. Hashemi, Laguna Niguel, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 38 days.

(21) Appl. No.: 09/661,490

(22) Filed: Sep. 14, 2000

Related U.S. Application Data

(63) Continuation-in-part of application No. 09/266,376, filed on Mar. 11, 1999.
(51) Int. Cl.[7] .................................................. H01L 23/29
(52) U.S. Cl. ....................... 257/788; 313/103; 313/105; 313/534; 428/322.7; 174/250
(58) Field of Search ................................. 313/103, 105, 313/534; 428/322.7; 174/250

(56) References Cited

U.S. PATENT DOCUMENTS

| | | |
|---|---|---|
| 5,700,981 A | 12/1997 | Tuttle et al. |
| 5,900,312 A | 5/1999 | Sylvester |
| 6,384,519 B1 * | 5/2002 | Beetz et al. ......... 313/103 CM |

* cited by examiner

*Primary Examiner*—David Nelms
*Assistant Examiner*—Mai-Huong Tran

(57) ABSTRACT

Method and structure for temperature stabilization in semiconductor devices are disclosed. In one embodiment, a carbon-based polymer is deposited on top of an interconnect metal line in the semiconductor die where relatively large power dissipation is known to occur. Reduction of the range of temperature excursions in the semiconductor die is achieved since the polymer acts as a cushion to dampen the range of temperature excursions of the semiconductor die. During occurrence of power pulses in the semiconductor die, the polymer absorbs energy from the interconnect metal, and thus from the semiconductor devices that are connected to the interconnect metal, by expanding without a rise in the temperature of the polymer. The energy generated when power pulses are being dissipated in the semiconductor die does not result in a substantial rise in the temperature of the polymer. Accordingly, the temperature of the semiconductor devices that are connected to the interconnect metal is not abruptly increased during power pulses. Similarly, during the time that no power pulse is being dissipated by the semiconductor die, the polymer releases the stored energy by contracting to its original shape while maintaining a constant temperature. Thus, the temperature of semiconductor devices which are in thermal contact with the polymer is not abruptly decreased when no power pulse is being dissipated in the semiconductor die. In this manner the range of temperature excursions in the semiconductor die is reduced.

7 Claims, 6 Drawing Sheets

METHOD AND STRUCTURE FOR TEMPERATURE STABILIZATION IN SEMICONDUCTOR DEVICES

This application is a continuation in part of, and claims benefit of the filing date of, and hereby incorporates fully be reference, the pending parent application entitled "Cooling System for Pulsed Power Electronics," Ser. No. 09/266,376 filed Mar. 11, 1999 and assigned to the assignee of the present application.

BACKGROUND OF THE INVENTION

1. Field of the Invention

The present invention is generally in the field of temperature stabilization in semiconductor packages. In particular, the present invention is in the field of temperature stabilization for internal circuits in a semiconductor die.

2. Background Art

As the performance, speed, and complexity of semiconductor devices increase, semiconductor devices tend to increasingly generate significant amounts of heat. Moreover, the continually shrinking packaging containing semiconductor devices has contributed to a reduction of the ability of these devices to dissipate heat through convection. The space surrounding these devices has become significantly more confined as packaging sizes shrink, thereby reducing the opportunity for convection currents to circulate and remove heat.

In addition, the increasing popularity of portable electronic devices such as cellular phones, portable televisions, palm top computers, and pagers has contributed to a demand for using smaller packages made of lighter material such as plastics which are generally lighter than metals. Plastics, relative to metals, however, generally tend to have a greater resistance to heat transfer. The opportunity for heat transfer, and the cooling of the power circuitry via conduction, is thus significantly reduced by the increasing use of non-metallic and plastic packaging materials.

Reliability of semiconductor devices is related to the temperature of the devices. Manufacturers of portable electronic systems have sought to reduce the amount of heat generated by the semiconductor devices within those systems, and to spread the heat that is generated, in order to reduce peak temperatures which would affect the reliability of the semiconductor devices within those systems. Manufacturers have made efforts to reduce or spread the heat specifically within power devices, which tend to generate a significant amount of heat.

Some manufacturers of power devices have taken the approach of adding metal heat sinks to their power devices. However, the effectiveness of the heat sinks diminishes with the air volume available for convection cooling surrounding the heat sink. Thus, the increasingly small size of portable electronic devices, as well as the size reduction of the semiconductor packaging itself, have reduced the effectiveness of heat sinks.

Another method of reducing power consumption, and therefore heat generation, is to employ a digital design. Digital communication systems are, in large part, replacing analog communication systems. This is so because digital systems, generally, can offer increased performance and lower overall power consumption than analog systems. Digital systems commonly operate in a time sharing mode or pulse mode. That is a digital system will turn on, broadcast data and then turn off. This time sharing mode allows several communications systems to share the same frequency without interfering with each other. A time sharing system can also lower overall power dissipation of a communication system, because it operates for only a fraction of the time that a continuous system operates.

The rapid cycling on and off of the output of the time sharing system can, however, give rise to significant peak power dissipation. The rapid power cycling of devices can lead to continual thermal stress as the devices are turned on, dissipate considerable power, and then are turned off. In the confined space of a personal communication device, such as a portable telephone, the temperature swings due to the rapid cycling of power can lead to significant, continuous thermal and mechanical stress on the semiconductor devices, circuit connections, wire bonds, and other mechanical connections. As stated above, portable electronic devices cannot house heat sinks to reduce the temperature swings due to the rapid cycling of power.

Thus, there is a need to reduce the thermal and mechanical stress, induced by power cycling, to increase overall reliability in digital time sharing or pulse mode communication systems and other power cycling digital systems. In other words, there is serious need in the art to reduce the magnitude of temperature excursions due to the rapid cycling of power in digital systems.

SUMMARY OF THE INVENTION

The present invention is method and structure for temperature stabilization in semiconductor devices. The invention results in a reduction in the range of temperature excursions in a semiconductor die. The reduction in the range of temperature excursions results in a reduction of thermal and mechanical stress during operation of the semiconductor die and thus improves the performance and reliability of the semiconductor die.

The invention utilizes and incorporates a carbon-based polymer to reduce the range of temperature excursions in the semiconductor die. In one embodiment of the invention, a carbon-based polymer is deposited on top of an interconnect metal line in the semiconductor die where relatively large power dissipation is known to occur.

Reduction of the range of temperature excursions in the semiconductor die is achieved since the polymer acts as a cushion to dampen the range of temperature excursions of the semiconductor die. During occurrence of power pulses in the semiconductor die, the polymer absorbs energy from the interconnect metal, and thus from the semiconductor devices that are connected to the interconnect metal, by expanding without a rise in the temperature of the polymer. The energy generated when power pulses are being dissipated in the semiconductor die does not result in a substantial rise in the temperature of the polymer. Accordingly, the temperature of the semiconductor devices that are connected to the interconnect metal is not abruptly increased during power pulses.

Similarly, during the time that no power pulse is being dissipated by the semiconductor die, the polymer releases the stored energy by contracting to its original shape while maintaining a constant temperature. Thus, the temperature of semiconductor devices which are in thermal contact with the polymer is not abruptly decreased when no power pulse is being dissipated in the semiconductor die. In this manner the range of temperature excursions in the semiconductor die is dramatically reduced by the present invention.

DETAILED DESCRIPTION OF THE INVENTION

The present invention is method and structure for temperature stabilization in semiconductor devices. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
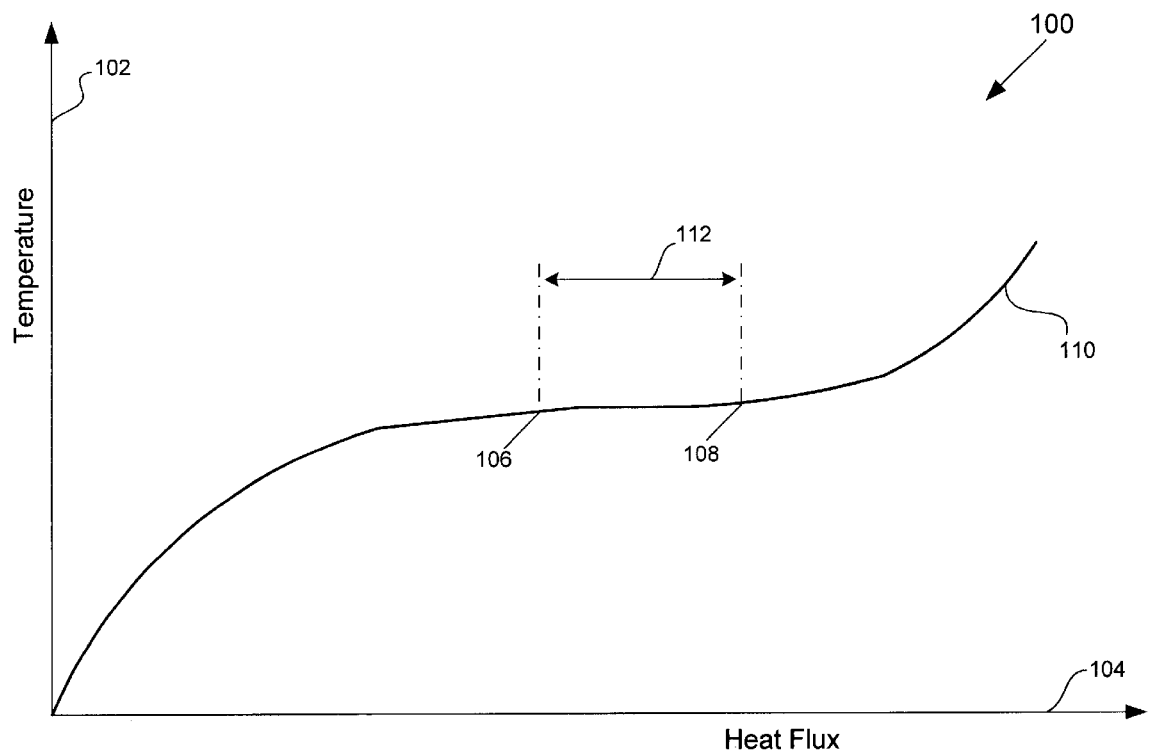
FIG. 1 shows the temperature response of a PCM material as a function of heat flux.

Phase Change Material (also referred to as "PCM" or "PCM material") are compounds whose temperature remains substantially constant during a phase change from solid to liquid and vice versa. During such a change in phase, the PCM material absorbs and releases energy while the temperature of the PCM material remains substantially unchanged. Examples of PCM materials are paraffins, eutectic salts, and hydrated salts. FIG. 1 shows the temperature change in a PCM material as a function of heat flux. It is noted that heat flux is proportional to power divided by the area over which the power is dissipated or absorbed by the PCM material. Y-axis 102 of the graph 100 in FIG. 1 corresponds to the temperature of the PCM material while x-axis 104 corresponds to the heat flux. Curve 110 shows that in response to increasing heat flux the temperature of the PCM material rises to point 106. Beginning from point 106, the phase of the PCM material begins to change from solid to liquid. A phase change in the PCM material from point 106 to point 108 takes place while the temperature of the PCM material remains substantially constant. As shown in graph 100, in the region between points 106 and 108, which is pointed to generally by numeral 112, the temperature of the PCM material remains substantially constant.

Figure 2:
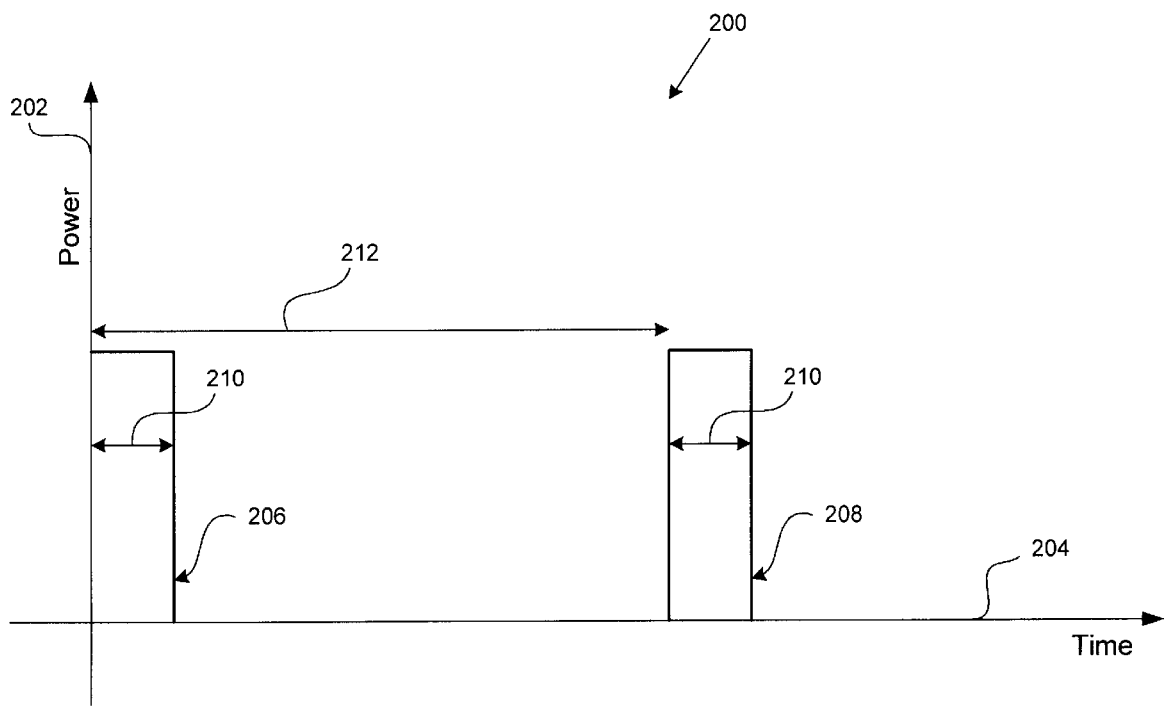
FIG. 2 is a graph of power dissipation versus time for an example pulse power system.

FIG. 2 is a graph of power dissipation versus time for an example pulse power system as may be found, for example, in a Time Division Multiple Access (TDMA) portable phone. FIG. 2 is used merely for example purposes to illustrate the present invention. However, it is manifest that the present invention is by no means limited to pulse power or TDMA systems. As discussed below, the invention can be applied to reduce the range of temperature excursions or to eliminate temperature excursions altogether in any semiconductor device.

In graph 200 of FIG. 2, y-axis 202 corresponds to dissipated power and x-axis 204 corresponds to time. FIG. 2 illustrates the timing of successive power pulses 206 and 208. In the example shown in FIG. 2, width 210 of pulses 206 and 208 is approximately 525 microseconds. Period 212 which is measured from the rising edge of pulse 206 to the rising edge of pulse 208 is approximately 4200 microseconds. Thus, pulses 206 and 208 are separated by approximately 3675 microseconds. In the example of graph 200 shown in FIG. 2, the duty cycle of power pulses 206 and 208 is 12.5%. By way of example, if a Gallium Arsenide ("GaAs") power amplifier is used in a TDMA system, each power pulse shown in FIG. 2 would have a power peak of approximately 3.0 watts.

The time values shown in FIG. 2 are typical for some Time Division Multiple Access (TDMA) phones, for example those following the GSM (Global System for Mobile communication) standard. Communications systems, such as TDMA phones, which operate by broadcasting information in a pulse mode are commonplace. In addition many electronic devices, PCS phones, portable phones, pulse lasers, power supplies, radar, television, and many other devices within and outside of the communication arts operate, at least partially, in a pulsed format, and may therefore have a power dissipation behavior that looks similar to the pulsed power dissipation illustrated in graph 200 of FIG. 2.

The temperature of a semiconductor device is a function of the power dissipation in the device. Thus, a semiconductor device manifests temperature excursions with a period determined by the period of the power pulses, that period being 4200 microseconds in the example of FIG. 2. Moreover, the range of such temperature excursions (i.e. the amplitude of the temperature excursions) is directly proportional to the peak power dissipation during the power pulses.

Figure 3A:
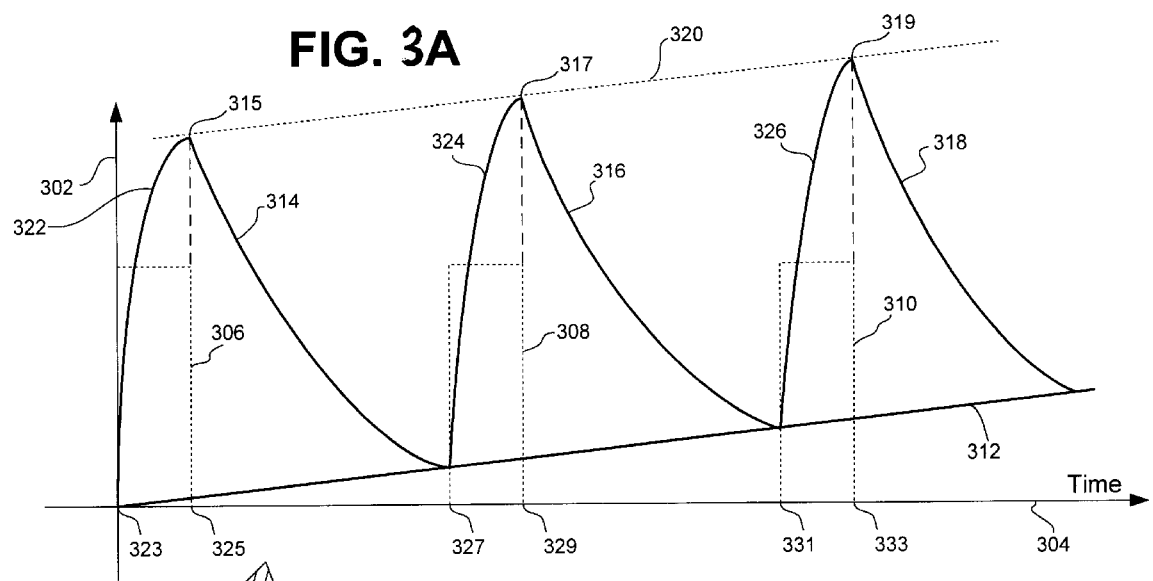
FIG. 3A illustrates the initial transient temperature response of an exemplary power amplifier to a series of power pulses.
Figure 3B:
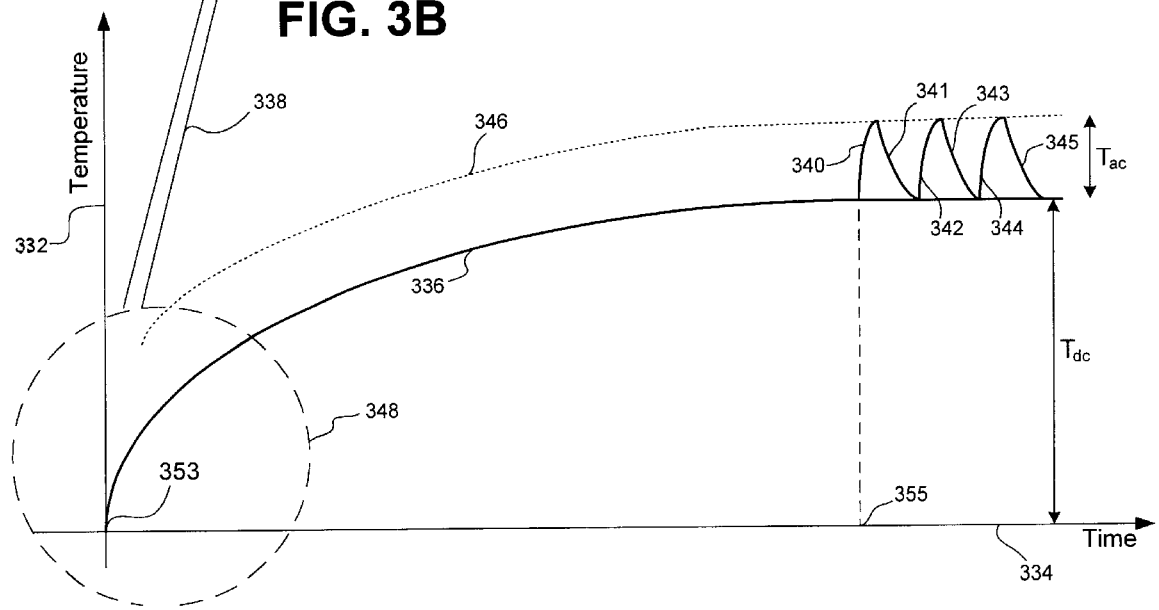
FIG. 3B illustrates both the steady state temperature response as well as the initial transient temperature response of an exemplary power amplifier to a series of power pulses.

FIGS. 3A and 3B illustrate the temperature response of a semiconductor device, such as a power amplifier operating in a pulse mode, which dissipates power according to graph 200 of FIG. 2. Referring to FIG. 3A, the initial transient temperature response of the power amplifier (which is used as an example to illustrate the present invention) is shown. Three power pulses 306, 308, and 310 are shown in dotted lines. Each of these three power pulses is analogous to power pulse 206 or 208 in FIG. 2. Curves 312, 322, 314, 324, 316, 326, and 318 in FIG. 3A show the temperature response of the exemplary power amplifier in response to power pulses 306, 308, and 310. X-axis 304 corresponds to time. Y-axis 302 corresponds to power when discussing power pulses 306, 308, and 310. When discussing temperature curves 312, 322, 314, 324, 316, 326, and 318, y-axis 302 corresponds to temperature. Temperature curves 312, 322, 314, 324, 316, 326, 318 and power pulses 306, 308, and 310 are superimposed and shown in the same graph solely for ease of understanding their temporal relationship along the x-axis. Thus, no unitary vertical scale is intended by the y-axis and FIG. 3A is for the purpose of illustrating the temporal behavior of the temperature curves relative to the temporal behavior of power pulses.

Curve 322 shows that the temperature of the power amplifier begins to increase from time 323 to time 325. The time period between time 323 to time 325 corresponds to the duration of power pulse 306. As shown in FIG. 3A, peak temperature 315 in temperature curve 322 is reached at time 325. From time 325 to time 327 no power is being dissipated in the power amplifier since the power pulse terminated at time 325. Temperature curve 314 shows the gradual decrease in the temperature of the power amplifier from time 325 to time 327 when no power is being dissipated in the power amplifier. However, prior to the temperature of the power amplifier falling completely back to its original level (i.e. its level at time 323), another power pulse, i.e. power pulse 308 is initiated. The temperature of the power amplifier begins to increase from time 327 to time 329 in response to power pulse 308.

Temperature curve 324 shows that the temperature of the power amplifier begins to increase from time 327 to time 329. The time period between time 327 to time 329 corresponds to the duration of power pulse 308. As shown in FIG. 3A, peak temperature 317 in temperature curve 324 is reached at time 329. From time 329 to time 331 no power is being dissipated in the power amplifier since the power pulse terminated at time 329. Temperature curve 316 shows the gradual decrease in the temperature of the power amplifier from time 329 to time 331 when no power is being dissipated in the power amplifier. However, prior to the temperature of the power amplifier falling completely back to its previous level (i.e. its level at time 327), another power pulse, i.e. power pulse 310 is initiated. The temperature of the power amplifier begins to increase from time 331 to time 333 in response to power pulse 310.

Temperature curve 326 shows that the temperature of the exemplary power amplifier begins to increase from time 331 to time 333. The time period between time 331 to time 333 corresponds to the duration of power pulse 310. As shown in FIG. 3A, peak temperature 319 in temperature curve 326 is reached at time 333. Temperature curve 318 shows the gradual decrease in the temperature of the power amplifier after time 333 until another power pulse is initiated in the power amplifier.

Baseline temperature curve 312 shows that the temperature of the semiconductor device (i.e. the power amplifier in this example), continues to increase due to the continuing stream of power pulses that are initiated and dissipated and because the semiconductor device does not completely cool off between two adjacent power pulses. Thus in the initial transient portion of the operation of the semiconductor device shown in FIG. 3A, the baseline temperature of the device continues to increase as shown by curve 312. Along with the gradual rise in the baseline temperature of the device, there are temperature excursions 322, 314, 324, 316, 326, and 318. The upper boundary of the temperature excursions is shown by dotted curve 320. Thus, solid curve 312 and dotted curve 320 constitute an envelope within which temperature excursions 322, 314, 324, 316, 326, and 318 occur.

As stated above, FIG. 3A illustrated the initial transient temperature response of a semiconductor device and the timing relation of the initial transient temperature response to a series of power pulses 306, 308, and 310. FIG. 3B covers a longer period of time which includes the initial transient temperature response of the semiconductor device, as well as the steady state temperature response of the device, to a large number of power pulses. The initial transient response of the semiconductor device (i.e. the power amplifier in the present example) comprises those portions of solid curve 336 and dotted curve 346 that are enclosed in circle 348 in FIG. 3B. An expanded view of the initial transient response enclosed by circle 348 was already illustrated in FIG. 2A. Arrow 338 in FIG. 3B points to FIG. 2A to indicate that an expanded view of the initial transient response to the initial series of power pulses is shown in FIG. 2A.

As shown in FIG. 3B, y-axis 332 corresponds to temperature while x-axis 334 corresponds to time. Solid curve 336 represents the baseline temperature of the semiconductor device as its temperature gradually rises from time 353 until time 355 when the temperature of the device reaches its steady state condition. A typical amount of time necessary to reach the steady state condition for an exemplary power amplifier is approximately three to five minutes. Thus, time 355 is approximately three to five minutes after the initial device turn-on at time 353. During steady state condition which prevails after time 355, the baseline temperature of the device is substantially constant as shown by curve 336 in FIG. 3B. This constant steady state temperature is referred to as $T_{dc}$ as shown in FIG. 3B.

As illustrated in FIGS. 3A and 3B, in response to the series of power pulses dissipated in the semiconductor device, a series of temperature excursions occur. Thus, absent the method and structure of the present invention, temperature excursions occur all along the operation of the semiconductor device in response to power pulses. Referring to FIG. 3B, beginning from time 353 to time 355 and thereafter, temperature excursions occur in response to each power pulse. The initial transient temperature excursions were shown in FIG. 3A. The steady state temperature excursions are shown as temperature excursions 340, 341, 342, 343, 344, and 345 in FIG. 3B.

The upper limit of the temperature excursions during both the initial transient condition and the steady state condition is indicated by dotted curve 346. Absent the present invention, the range of temperature excursions during the operation of the semiconductor device remains relatively large and constant. The range of temperature excursions during the operation of the semiconductor device is referred to by $T_{ac}$ and is shown in FIG. 3B. Thus, the envelope defined by solid curve 336 and dotted curve 346 defines the range of the temperature excursions (i.e. the value of the $T_{ac}$) during the operation of the exemplary power amplifier. As stated above, the present invention reduces or altogether eliminates (i.e. sets to zero) the range of temperature excursions $T_{ac}$ and thus stabilizes the temperature of the semiconductor device despite the continued occurrence of power pulses.

The various applications of PCM was described in an invention disclosed in the co-pending parent application entitled "Cooling System for Pulsed Power Electronics," Ser. No. 09/266,376 filed Mar. 11, 1999, and assigned to the assignee of the present application. As stated above, the present application is a continuation in part of, and claims benefit of the filing date of, and hereby incorporates fully be reference, that pending parent application. An invention disclosed in another co-pending application entitled "Method And Structure For Temperature Stabilization In Flip Chip Technology," Ser. No. 09/493,591 filed Jan. 31, 2000 and assigned to the assignee of the present application also discloses various applications of PCM. That co-pending application, i.e. application Ser. No. 09/493,591, is also hereby incorporated fully be reference in the present application.

According to the present invention, a polymer having PCM characteristics is utilized to minimize or eliminate temperature excursions during the operation of semiconductor devices such as the exemplary power amplifier discussed above. The polymer will be situated in areas of the semiconductor die where temperature excursions normally occur, also referred to as "power dissipation areas" in the present application, in order to minimize or eliminate these temperature excursions.

Polymers are made up of groups of large, heavy molecules that occur in a repeating pattern within the polymer. These molecules typically contain carbon, hydrogen and oxygen atoms. Some polymers exhibit PCM characteristics such that they will absorb energy by changing phase from a solid to a liquid. Similarly, these polymers will release energy by returning to their original state. The temperature of the polymer remains substantially constant during this absorption and release of energy.

Other polymers can maintain a substantially constant temperature while absorbing and releasing energy without entirely changing phase. As the temperature of the polymer increases, the polymer expands. While the polymer is expanding, the temperature of the polymer remains substantially constant since the energy is expended to expand the polymer. When the polymer releases energy, it will regain its original shape and the temperature will remain substantially constant while the polymer contracts back to its original shape.

Thus, the energy generated during power dissipation pulses of a device such as a power amplifier will be absorbed by the expansion of the polymer without a rise in the temperature of the polymer. When no power is being dissipated by the power amplifier, the polymer releases energy by resuming its original shape while the temperature of the polymer remains substantially constant. As such, the range of temperature excursions occurring in the polymer and in the semiconductor devices in thermal contact with the polymer is relatively small. A polymer with these expansion and contraction characteristics is used in the following embodiments of the invention.

In the present embodiment, the polymer is deposited over an metal interconnect line on an interconnect substrate. This interconnect metal line can be used, for example, to connect a power amplifier to other semiconductor devices on the substrate. During power pulses, there will be temperature excursions within the power amplifier, and there will be corresponding temperature excursions in the interconnect metal line to which the power amplifier is connected and with which it is in thermal contact. Thus, this interconnect metal line is an example of what is also referred to as a "power dissipation area" in the present application.

The polymer deposited over the interconnect metal is in thermal contact with the interconnect metal and absorbs and releases the thermal energy from the interconnect metal, and thus absorbs and releases the thermal energy generated by the power amplifier, without corresponding changes in the temperature of the polymer, as discussed above. Thus, temperature excursions within the power amplifier are minimized or eliminated by the absorption and release of thermal energy by the polymer. The types of polymers that can be used in the present invention include carbon-based polymers. For example, polyolefins, polyethylene, polypropylene, polystyrene, polyacrylonitrile, and polymethyl methacrylate are the types of polymers that can be used in the present invention.

The invention's method for fabricating this interconnect metal-polymer structure is discussed below.

Figure 4A:
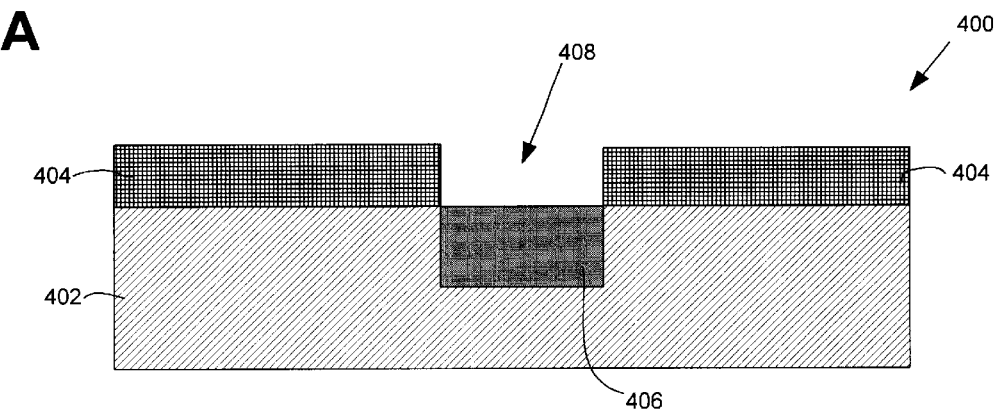
FIG. 4A illustrates a cross section of an area of a semiconductor die, showing an opening in an inter layer dielectric situated over an interconnect metal line.

FIG. 4A shows a cross section of an area of semiconductor die 400. Interconnect metal line 406 has been patterned in an inter-layer dielectric ("ILD") 402 in a manner known in the art. Interconnect metal line 406 can be in any of several interconnect levels in a semiconductor die. As an example, in a six level interconnect metal process, interconnect metal line 406 can be at interconnect level one, interconnect level two, or any of the other four interconnect levels in the semiconductor die. Moreover, interconnect metal line 406 may be patterned using a subtractive etching process or, alternatively, a damascene process.

As shown in FIG. 4A, ILD 404 rests on top of ILD 402 and an opening 408 in ILD 404 has been patterned and etched over interconnect metal line 406 in a manner known in the art. In the present example, ILD 402 and ILD 404 can be polyimide, silicon nitride, silicon oxynitride, or other low-k dielectric material, while interconnect metal line 406 can be aluminum or copper.

The first step of the invention's method is to clean the surface of ILD 404 along with the surface of interconnect metal line 406. The cleaning step is performed to provide better adhesion between the polymer and the surfaces of ILD 404 and interconnect metal line 406. By way of example, the cleaning step can be performed by placing semiconductor die 400 in a rotation device. A rotating brush is brought close to semiconductor die 400 as a stream of deionized water is sprayed on the surfaces of ILD 404 and interconnect metal line 406. The motion of the brush causes the deionized water to move very rapidly. The rapid motion of the deionized water on the surfaces of ILD 404 and interconnect metal line 406 cleans the surfaces of ILD 404 and interconnect metal line 406. Acids, such as sulfuric acid, or bases may be added to the water to remove certain types of impurities from the surface of ILD 404 and interconnect metal line 406.

An additional step is sometimes performed at this point. The surface of semiconductor die 400 may be exposed to plasma in a manner known in the art. The plasma creates a rougher and cleaner surface on ILD 404 and interconnect metal line 406. The rougher surface results in more surface area on which adhesion may occur with the polymer to be deposited in the next step. In addition, the crevices in the rough surface "lock" the polymer to be deposited in the next step and thus result in a better adhesion between the polymer and ILD 404 and interconnect metal line 406. As an example, argon/oxygen plasma may be used in this step.

Figure 4B:
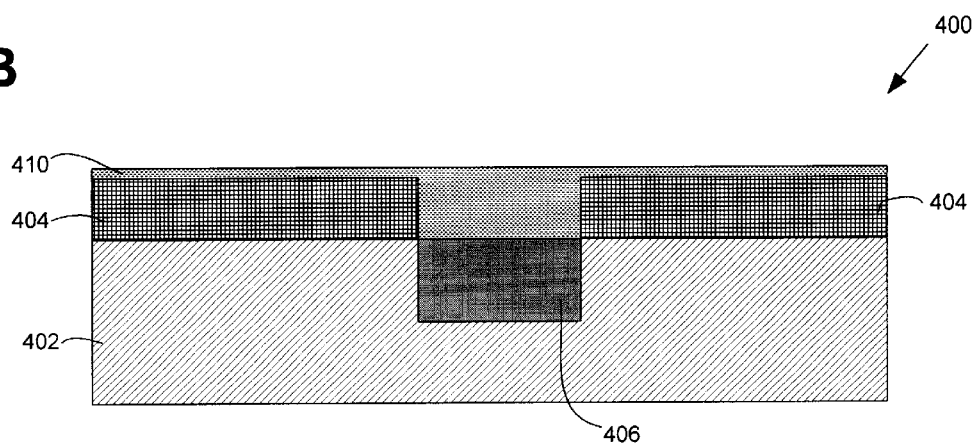
FIG. 4B illustrates a polymer layer deposited over the inter layer dielectric and filling the opening in the inter layer dielectric situated over the interconnect metal line.

FIG. 4B shows the result of the next step according to the present invention. Polymer 410 has been deposited over ILD 404 and interconnect metal line 406. Polymer 410 should be selected to exhibit the desired energy absorption and release characteristics and to tolerate temperatures between 40 and 200 degrees centigrade, which is the range of temperatures involved during operation of semiconductor devices. Polymer 410 may be deposited over semiconductor die 400 using either a spin-on process or chemical vapor deposition ("CVD").

As an example of a spin-on process, the semiconductor wafer containing semiconductor die 400 is placed into a spinner machine. Liquid polymer is deposited in the center of the wafer to form a "puddle." The initial size of this puddle is determined in a manner known in the art to ensure complete coverage of the semiconductor wafer by the polymer, while at the same time avoiding buildup of the polymer on the edges or back of the semiconductor wafer. After the desired puddle size is reached, the spinner is turned on and the semiconductor wafer is accelerated so that the liquid polymer is spread across the surface of the wafer. The spin continues for a period after the polymer has spread to allow for drying of the polymer. The result of this process, depending on spin time and RPM rate, is a thin, uniform layer of polymer over the surface of the semiconductor wafer and, in particular, over the surface of semiconductor die 400. The polymer also fills opening 408 during this process as shown in FIG. 4B.

Figure 4C:
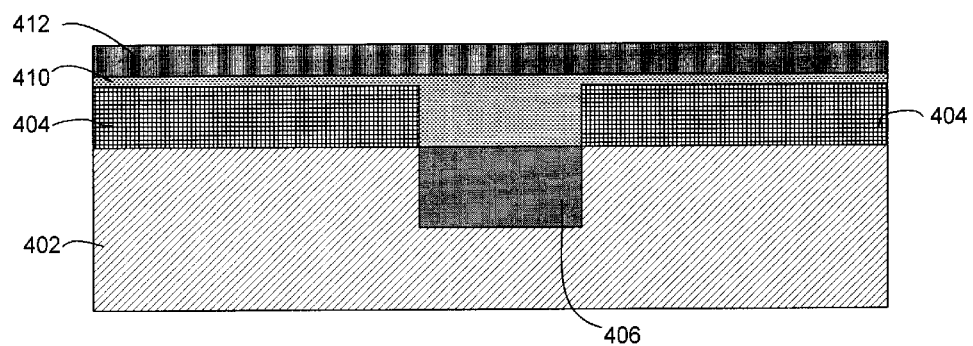
FIG. 4C illustrates photoresist deposited over the polymer layer.
Figure 4D:
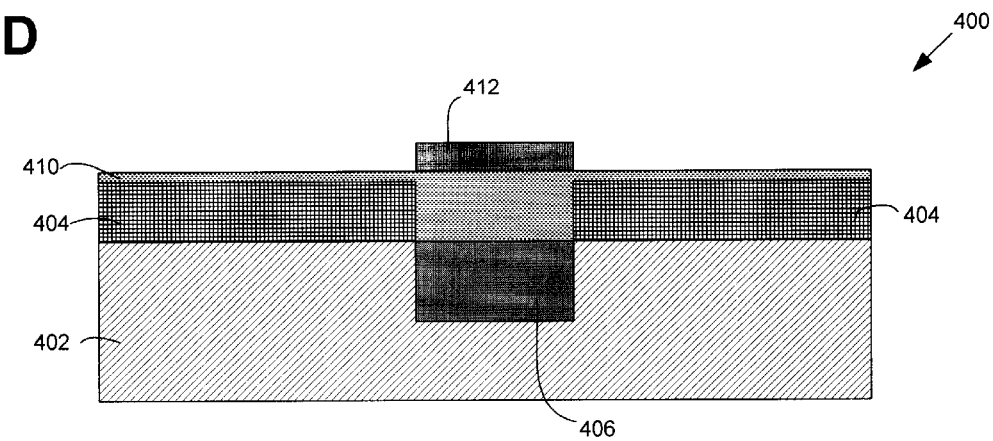
FIG. 4D illustrates the patterned photoresist which is left over the polymer layer after stripping the unwanted photoresist.

As an example of a CVD or PVD ("Physical Vapor Deposition") process, plasma enhanced CVD ("PECVD") may be used to deposit the polymer over the surface of semiconductor die 400. Vapors containing the polymer to be deposited are kept in a low-pressure chamber. The semiconductor wafer containing semiconductor die 400 is placed in the chamber. A plasma source is used to create a plasma field in the deposition vapor. The plasma field allows for uniform deposition of the vaporized polymer over the surface of the semiconductor wafer containing semiconductor die 400 at a relatively low temperature. FIG. 4C shows the result of the next step according to the present invention. Photoresist 412 has been deposited over the surface of polymer 410. As an example, photoresist 412 may be deposited over the surface of semiconductor die 400 in an even, uniform layer by using the spin-on process described above. FIG. 4D shows the result of the next step according to the invention. After depositing photoresist 412, a photo mask (not shown) is used to pattern photoresist 412 in a manner known in the art. In the present example, the pattern of the photo mask is designed to leave photoresist 412 only over the portion of polymer 410 which is situated over interconnect metal line 406. The remaining unwanted portion of photoresist 412 is stripped away in a manner known in the art.

Figure 4E:
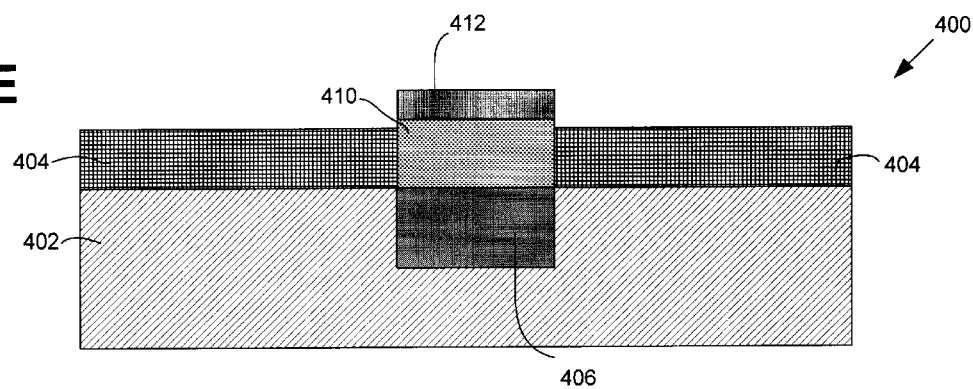
FIG. 4E illustrates the remaining polymer within the opening in the inter layer dielectric situated over the interconnect metal line along with the remaining photoresist after the unwanted polymer has been etched away.

FIG. 4E shows the result of the next step according to the present invention. The unwanted portion of polymer 410 is etched away in a manner known in the art. The etch chemistry chosen for this step is based on the properties of the particular polymer used. The only remaining portion of polymer 410 after this etch step is the portion covering interconnect metal line 406.

Figure 4F:
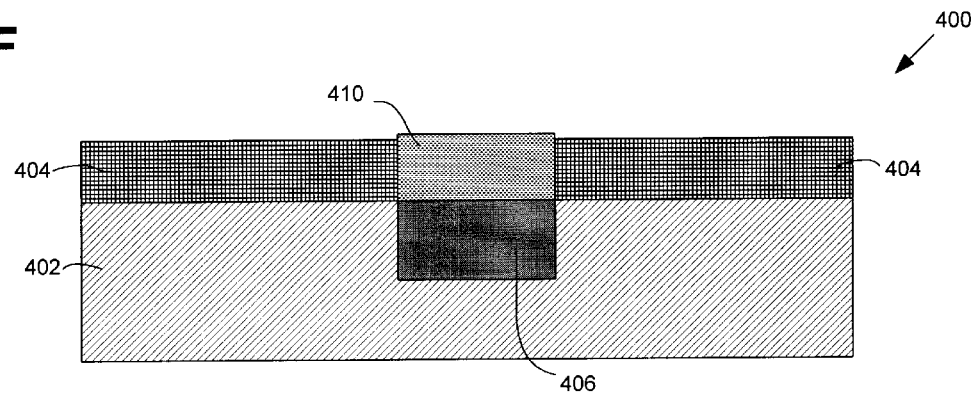
FIG. 4F illustrates the final structure of an embodiment of the invention after the remaining photoresist has been stripped.

FIG. 4F shows the result of the final step in this embodiment of the invention. The remaining photoresist 412 is stripped away in a manner known in the art, leaving polymer 410 uncovered. It is noted that after this step, polymer 410 is not necessarily flush with the surface of ILD 404. Therefore, if an even, uniform surface across semiconductor die 400 is desired, a planarization step is required, depending on device application and further process steps.

It is manifest to a person of ordinary skill in the art that the present invention can be practiced in a number of ways. For example, interconnect metal line 406 can be part of any of several interconnect levels in a semiconductor die. In one embodiment, interconnect metal line 406 is part of the very top interconnect level. As an example, in a six level interconnect metal process, interconnect metal line 406 would be part of the interconnect level six. In this embodiment, interconnect metal line 406 may be used as a line to distribute power to a number of devices in the semiconductor die.

Figure 5:
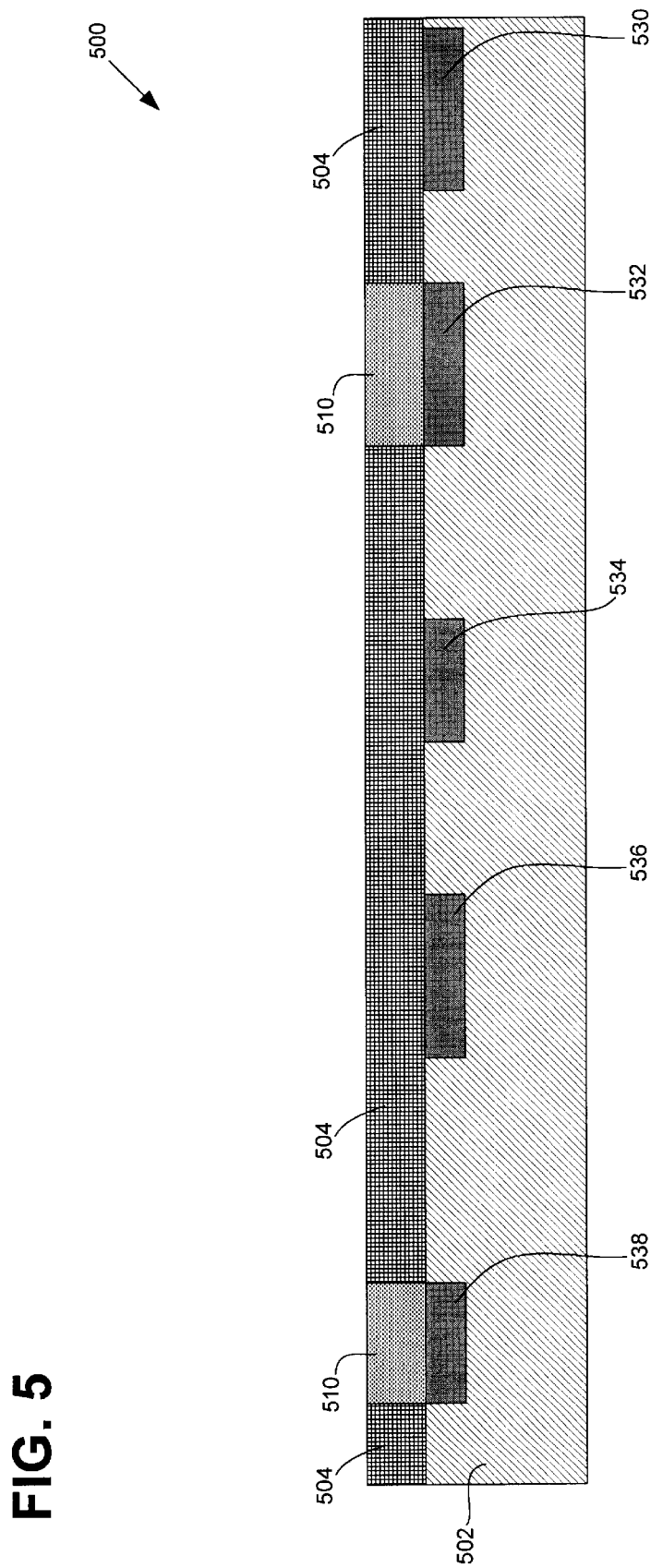
FIG. 5 illustrates the final structure of another embodiment of the invention where two interconnect metal power distribution lines are covered by a polymer.

To further illustrate this embodiment of the invention, FIG. 5 shows a cross section of an area in semiconductor die 500. FIG. 5 shows interconnect metal line 530, interconnect metal line 532, interconnect metal line 534, interconnect metal line 536, and interconnect metal line 538 which have been patterned in respective etched portions of ILD 502. Interconnect metals lines 530, 532, 534, 536, and 538 are all part of interconnect level six. Also shown in FIG. 5 is ILD 504 which rests on top of ILD 502. Polymer 510 has been deposited, in the manner described in the previous embodiment, into two openings within ILD 504 situated over interconnect metal line 532 and interconnect metal line 538. In the present example, ILD 502 and ILD 504 can be silicon dioxide while interconnect metal level six can be aluminum or copper.

As seen in FIG. 5, according to the present invention, polymer 510 can be selectively deposited in specific locations in semiconductor die 500 where temperature excursions are known to occur. As stated above, FIG. 5 shows five interconnect metal lines which have been patterned within ILD 502. In the present example, interconnect metal lines 532 and 538 are power distribution lines for a number of devices in semiconductor die 500. In contrast, interconnect metal lines 530, 534 and 536 are used for other purposes such as electrically connecting devices together.

Absent the method and structure of the present invention, temperature excursions on interconnect metal lines 532 and 538 will result from the fact that these interconnect metal lines are connected to a large number of devices on semiconductor die 500. When power pulses occur in the devices connected to interconnect metal lines 532 and 538, each of those devices contributes to a rise in the temperature of interconnect metal lines 532 and 538. Thus, interconnect metal lines 532 and 538 are "power dissipation areas" and are examples of areas of semiconductor die 500 where use of the invention is advantageous to reduce the potential temperature excursions.

Polymer 510 absorbs the thermal energy from interconnect metal lines 532 and 538, without a substantial change in the temperature of the polymer, as discussed above. The placement of polymer 510 over and in thermal contact with interconnect metal lines 532 and 538 thus minimizes or eliminates the temperature excursions in interconnect metal lines 532 and 538. As a result, the temperature excursions in each individual device connected to interconnect metal lines 532 and 538 is, in turn, minimized or eliminated.

In another embodiment of the invention, the polymer can be used on the diffusion regions where the semiconductor devices are located. As an example, the polymer could be situated on the gate, source, and drain areas of a MOS transistor. In this way, the polymer would act to minimize or eliminate the junction temperature excursions of the device.

In general, the invention can be implemented anywhere it is desirable to minimize or eliminate temperature excursions. The invention can be used within any of the interconnect levels or at the diffusion regions in a semiconductor die. Thus, in any area in the semiconductor die, where temperature excursions result from rapid cycling of power in digital systems, the invention can be implemented to minimize or eliminate temperature excursions.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method and structure for temperature stabilization in semiconductor devices have been described.

What is claimed is:

1. A semiconductor die comprising:
   a first plurality of interconnect metal lines corresponding to a first plurality of power dissipation areas;
   a second plurality of interconnect metal lines; and
   a carbon-based polymer situated on said first plurality of power dissipation areas of said first plurality of interconnect metal lines, wherein said carbon-based polymer is not situated on said second plurality of interconnect metal lines;
   said carbon-based polymer expanding and contracting so as to reduce a range of temperature excursions occurring in said first plurality of power dissipation areas in said semiconductor die.

2. The semiconductor die of claim 1 wherein at least one of said first plurality of power dissipation areas comprises a power distribution line on said semiconductor die.

3. The semiconductor die of claim 1 wherein at least one of said first plurality of power dissipation areas comprises a diffusion region in said semiconductor die.

4. The semiconductor die of claim 1 wherein said carbon-based polymer is selected from the group consisting of polyolefins, polyethylene, polypropylene, polystyrene, polyacrylonitrile, and polymethyl methacrylate.

5. The semiconductor die of claim 1 wherein said carbon-based polymer is deposited on said first plurality of power dissipation areas by a spin-on process.

6. A semiconductor die comprising:
   a power dissipation area;
   an opening within an interlayer dielectric, said opening situated above said power dissipation area; and
   a carbon-based polymer situated in said opening, said carbon-based polymer being in contact with said power dissipation area;
   said carbon-based polymer expanding and contracting so as to reduce a range of temperature excursions occurring in said power dissipation area in said semiconductor die;
   said opening containing and preventing said carbon-based polymer from leaving said power dissipation area when said carbon-based polymer expands.

7. A semiconductor die comprising:
   a power dissipation area situated in a first interlayer dielectric;
   a second interlayer dielectric situated over said first interlayer dielectric;
   an opening within said second interlayer dielectric, said opening situated above said power dissipation area; and
   a carbon-based polymer situated in said opening, said carbon-based polymer being in contact with said power dissipation area;
   said carbon-based polymer expanding and contracting so as to reduce a range of temperature excursions occurring in said power dissipation area in said semiconductor die;
   said opening containing and preventing said carbon-based polymer from leaving said power dissipation area when said carbon-based polymer expands.

* * * * *